United States Patent
Kang

(10) Patent No.: US 7,425,825 B2
(45) Date of Patent: Sep. 16, 2008

(54) ROTARY MANIPULATION INPUT APPARATUS

(75) Inventor: Eung-Cheon Kang, Hwaseong-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 13 days.

(21) Appl. No.: 11/546,875

(22) Filed: Oct. 13, 2006

(65) Prior Publication Data

US 2007/0211021 A1    Sep. 13, 2007

(30) Foreign Application Priority Data

Mar. 10, 2006  (KR) .................. 10-2006-0022562

(51) Int. Cl.
*G01B 7/30* (2006.01)
(52) U.S. Cl. .............. 324/207.25; 324/207.2; 324/207.21
(58) Field of Classification Search ......... 324/173–174, 324/207.2–207.25; 338/32 H, 32 R
See application file for complete search history.

(56) References Cited

U.S. PATENT DOCUMENTS

| | | | |
|---|---|---|---|
| 6,367,337 B1 * | 4/2002 | Schlabach | 73/862.331 |
| 6,396,259 B1 * | 5/2002 | Washeleski et al. | 324/207.22 |
| 6,836,039 B2 * | 12/2004 | Choi et al. | 310/81 |
| 7,005,596 B2 | 2/2006 | Maeda et al. | |
| 7,075,024 B2 | 7/2006 | Maeda et al. | |
| 7,095,198 B1 * | 8/2006 | O'Brien | 318/432 |
| 7,322,115 B2 * | 1/2008 | Besier et al. | 33/1 PT |
| 2003/0019113 A1 * | 1/2003 | Kofink et al. | 33/1 PT |
| 2005/0022617 A1 * | 2/2005 | Sano | 73/865.9 |

FOREIGN PATENT DOCUMENTS

| | | |
|---|---|---|
| JP | 2003-249139 | 9/2003 |
| JP | 2005-322509 | 11/2005 |
| JP | 2006-73311 | 3/2006 |
| KR | 10-2004-0048798 | 6/2004 |

OTHER PUBLICATIONS

Korean Office Action Issued with respect to Korean Application No. 10-2006-0022562, which corresponds to the above referenced application.

* cited by examiner

*Primary Examiner*—Jay M Patidar

(57) ABSTRACT

A rotary input apparatus is disclosed. The rotary input apparatus comprising a rotatable wheel, a multi-pole ring-type magnet secured to the bottom of the wheel to rotate together with the wheel, a printed circuit board on which one or more detection elements are mounted that are capable of detecting the rotation of the magnet and in which one or more receiving holes formed in correspondence with the detection elements, with at least a portion of the detection elements inserted in the receiving holes, a base to a side of which the printed circuit board is secured, and a holder joined to a side of the base and rotatably supporting the wheel, has a reduced thickness and has superior endurance to external impact.

7 Claims, 3 Drawing Sheets

ROTARY MANIPULATION INPUT APPARATUS

CROSS-REFERENCE TO RELATED APPLICATIONS

This application claims the benefit of Korean Patent Application No. 2006-0022562 filed with the Korean Intellectual Property Office on Mar. 10, 2006, the disclosure of which is incorporated herein by reference in its entirety.

BACKGROUND

1. Technical Field

The present invention relates to a rotary input apparatus.

2. Description of the Related Art

In general, a mobile terminal has the numbers 0-9 and the symbols * and # on a keypad of 12 keys. In addition to the numbers, there are also alphabet letters as well as consonants and vowels of Korean letters marked on such a keypad, to enable the input of information including numbers and letters. Recently, there are also navigation keys formed above the keypad equipped with a variety of functions such as phone number search, writing and managing text messages, and connecting to the Internet, etc. There are various forms of navigation keys, such as button types and rotary types, etc., but the use of rotary input apparatus is currently increasing, as they enable various functions such as menu browsing, etc.

As the latest mobile terminals are becoming more and more slim in shape, so also is there a demand for these rotary input apparatus to be slim. In addition to being slim, there is also a demand for endurance to withstand external impact. However, since in conventional rotary input apparatus there are Hall sensors or MR sensors, etc., mounted on the printed circuit board, etc., there is a limit to how much the thickness can be decreased. Also, since the portion supporting the rotary plate is generally secured to the base, etc., by means of molded products, the input apparatus are vulnerable to external impact.

SUMMARY

The present invention aims to provide a rotary input apparatus which has a reduced thickness, and which outputs rotation speed, direction, and angle, etc., to allow various types of input.

The invention also aims to provide a rotary input apparatus which has superior endurance to external impact, etc.

One aspect of the invention provides a rotary input apparatus comprising a rotatable wheel; a multi-pole ring-type magnet secured to the bottom of the wheel to rotate together with the wheel; a printed circuit board, on which one or more detection elements are mounted that are capable of detecting the rotation of the magnet, and in which one or more receiving holes formed in correspondence with the detection elements, with at least a portion of the detection elements inserted in the receiving holes; a base, to a side of which the printed circuit board is secured; and a holder joined to a side of the base and rotatably supporting the wheel.

The rotary input apparatus according to embodiments of the invention may include one or more of the following features. For example, the holder and/or the base may be made of metal. The holder may comprise a body portion positioned in contact with the wheel, an inclination portion extending in a particular angle from the body portion, and a securing portion extending from an end of the inclination portion and joined to a side of the base. Also, the base may have one or more insertion holes in which at least a portion of the detection elements may be positioned in correspondence with the receiving holes, and the detection element may be a Hall sensor or an MR sensor. The holder may have a plurality of push protrusions protruding downwards, and the printed circuit board may have one or more dome buttons pressed by the push protrusions.

The body portion may have an insertion hole and one or more ledges formed adjacent to the insertion hole, the wheel may have securing protrusions protruding downwards, and a washer in which one or more rotation holes of predetermined central angles are formed may be inserted onto the ledges, with the securing protrusions inserted into the rotation holes. The holder may have one or more support portion holes, formed in positions corresponding to the detection elements, in which at least portions of the detection elements are positioned. The wheel may have a center key formed at its center, and the printed circuit board may have dome buttons that are to be pressed by the center key.

Additional aspects and advantages of the present invention will be set forth in part in the description which follows and in part will be obvious from the description, or may be learned by practice of the invention.

DETAILED DESCRIPTION

Below, embodiments of the rotary input apparatus according to the invention will be described in more detail with reference to the accompanying drawings. In the description with reference to the accompanying drawings, those components are rendered the same reference number that are the same or are in correspondence regardless of the figure number, and redundant explanations are omitted.

Figure 1:
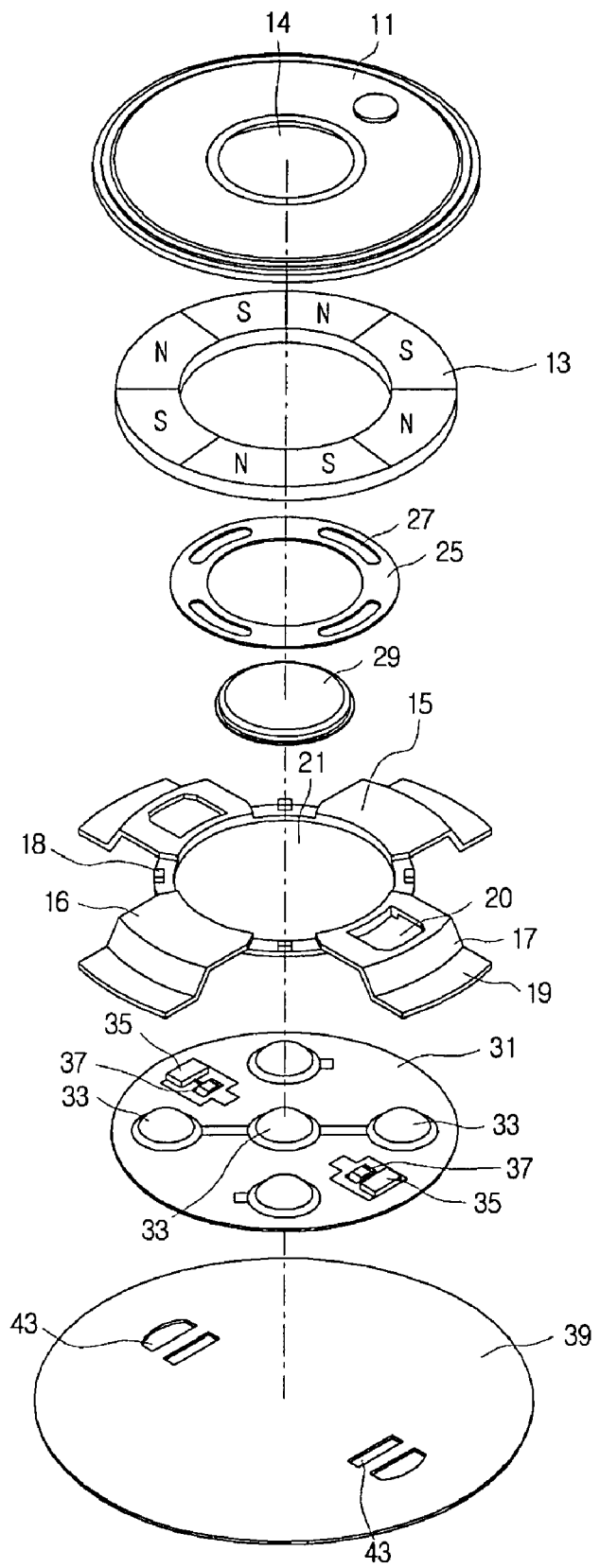
FIG. 1 is a perspective view of a rotary input apparatus in an unassembled state according to an embodiment of the invention.
Figure 2:
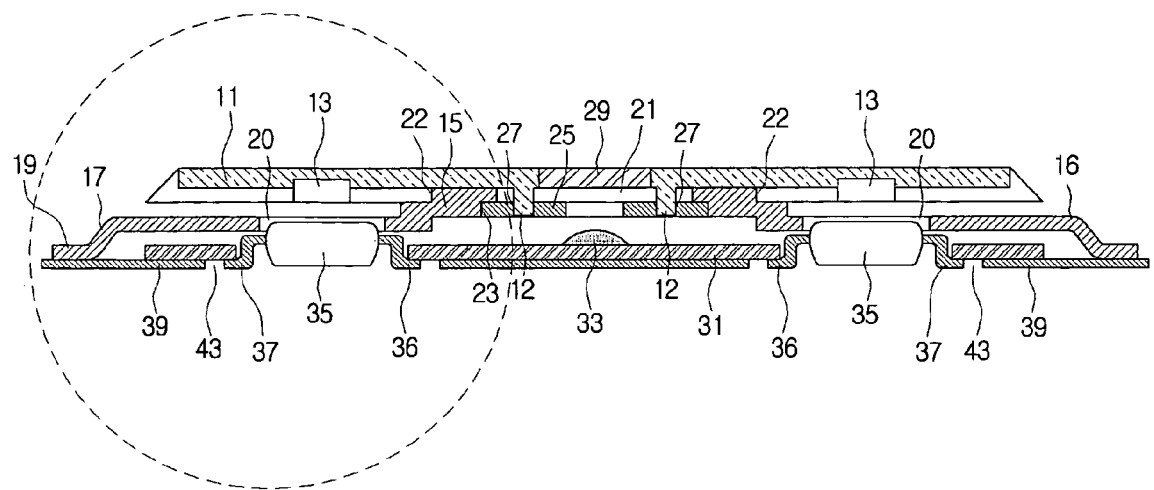
FIG. 2 is a cross-sectional view of the rotary input apparatus of FIG. 1 in an assembled state.

Referring to FIGS. 1 and 2, a rotary input apparatus according to an embodiment of the invention comprises a rotatably joined wheel 11, a washer 25 which secures the wheel 11 to a holder 15, a center key 29 joined at the center of the wheel 11, a ring-shaped magnet 13 secured to the bottom of the wheel 11 which rotates together with the wheel 11, the holder 15 joined to the upper surface of a base 39 for rotatably supporting the wheel 11, a printed circuit board 31 secured to the upper surface of the base 39, and Hall sensors 35 positioned in grooves of the printed circuit board 31 which are detection elements for sensing the rotation of the magnet 13.

As the holder 15 which rotatably supports the wheel 11 is made of metal and is secured directly on the base 39 also made of metal, the rotary input apparatus according to this embodiment has superior endurance to external impact. Also, it is returned to its original position by means of the elasticity of the metal holder 15 after an external force is removed, to provide a better tactile feel.

On the printed circuit board 31 having the Hall sensors 35, i.e. the detection elements, there are receiving holes 37 formed, in which at least portions of the Hall sensors 35 can be positioned, so that the thickness of the rotary input apparatus may be reduced by the thickness of a receiving hole 37. Also, by additionally forming insertion holes 43 on the base 39 in which may be positioned the Hall sensors 35, i.e. the detection elements, the thickness of the rotary input apparatus may further be reduced by the thickness of an insertion hole 43.

The wheel 11 is generally shaped as a circular plate, with an insertion hole 14 formed in the center through which the center key 29 may be inserted. The wheel 11 has a plurality of securing protrusions 12 adjacent to the insertion hole 14 that protrude downwards. As the securing protrusions 12 are inserted into the rotation holes 27 of the washer 25, the wheel 11 is rotatably secured to the holder 15. On the bottom surface of the wheel 11 is secured the magnet 13, which is magnetized to have multiple poles. The wheel 11 is rotated together with the magnet 13 by user operation, whereby a variety of inputs are made as the Hall sensors 35 sense the rotation angle, direction, and speed, etc., of the magnet 13. Also, a portion may be pressed by the user, so that a push protrusion formed on the reverse side of the holder 15 presses the upper surface of a dome button 33 to activate a separate function.

The securing protrusions 12, as illustrated in FIG. 2, are inserted through the center hole 21 of the holder 15 and the rotation holes 27 of the washer 25, with the ends processed such that they are not detached from the rotation holes 27. The washer 25 is inserted and secured onto the center of the holder 15, whereby the wheel 11 is secured to the holder 15. The central angles of the rotation holes 27 through which the securing protrusions 12 are inserted define the angle by which the wheel 11 is able to rotate.

The magnet 13 is attached to the bottom surface of the wheel 11 to be rotated together with the wheel 11, and such rotation of the magnet 13 is sensed by the Hall sensors 35 for an input based on the rotation angle. The magnet 13 has the shape of a ring magnetized to have alternating N- and S-poles, and the Hall sensors 35 are able to detect the rotation angle, direction, and speed of the wheel 11 according to the changes in N- and S-poles above the Hall sensors 35.

The holder 15 is secured to one side of the base 39 and rotatably supports the wheel 11. The holder 15 may be made of metal, such as stainless steel, etc., so that when the particular force applied on the wheel 11 is removed, the wheel 11 is returned to its original position due to the elasticity of the holder 15 itself. The holder 15 may be formed by press processing, etc. Of course, the holder 15 may also be formed by plastics, etc., that are high in elasticity.

The holder 15 includes a ring-shaped body portion 18, and a support portion 16 protruding from the perimeter of the body portion 18 and secured to a side of the base 39. The body portion 18 has a center hole 21 in the middle, and the support portion 16 protruding in four directions around the center hole 21 comprises an inclination portion 17 protruding downwards in a particular inclination, and a securing portion 19 extending horizontally from the end of the inclination portion 17.

The inclination portion 17 protrudes outwards and connects the body portion 18 and the securing portion 19. Since the inclination portion 17 is formed by metal, etc., having elasticity, when an external force applied on the holder 15 is removed, the holder 15 is returned to its original position by means of the elasticity of the inclination portion 17. Thus, even when a particular portion of the wheel 11 is pressed so that the wheel 11 becomes tilted, this elasticity allows it to be restored to its original position. The securing portion 19 extends from the end of the inclination portion 17 and is secured to the upper surface of the base 39 to secure the holder 15. The securing portion 19 may be secured to the base 39 by means of adhesive or tape, etc.

Since the holder 15 is secured directly to a side of the base 39 by means of adhesive, etc., the rotary input apparatus according to this embodiment has superior endurance to external impact. Also, the elasticity of the holder 15, which is formed of metal, allows not only the holder 15 itself but also the wheel 11 to be restored to their original positions, to provide a better tactile feel.

In the support portion 16 are formed support portion holes 20. As illustrated in FIG. 2, a portion of the Hall sensor 35, i.e. the sensing means, may be positioned in the support portion hole 20. Also, the body portion 18 has ledges 23 formed adjacent to the center hole 21.

The support portion holes 20 in the support portion 16 are formed to correspond with the Hall sensors 35 mounted on the printed circuit board 31, and as illustrated in FIG. 2, hold portions of the Hall sensors 35. The center hole 21 is formed in the center of the holder 15. Also, the wheel 11 is rotatably inserted onto a perimeter 22 forming the center hole 21, to prevent the wheel 11 from becoming detached. The ledges 23, as illustrated in FIG. 2, are formed adjacent to the center hole 21. The washer 25 is inserted and secured onto the ledges 23.

As illustrated in FIG. 1, the washer 25 is generally shaped as a donut, with a plurality of rotation holes 27 formed in certain intervals along the ring. The washer 25 is inserted and secured onto the ledges 23 to define the angle by which the wheel 11 is able to rotate. While there are four arc-shaped rotation holes 27 illustrated in this embodiment, the invention is not thus limited, and it is to be appreciated that the number and central angles of the rotation holes 27 may be changed according to design considerations. For example, one or two rotation holes 27 formed along the ring of the washer 25 with a central angle of 180° or 360° may be used for the rotation holes 27.

The center key 29 is inserted through the insertion hole 14 of the wheel 11 and supported by elastic rubber (not shown), etc. The center key 29 is pressed by the user to perform a particular function, examples of which include connecting to the Internet or receiving DMB (Digital Multimedia Broadcasting), etc.

The printed circuit board 31 has the shape of a circular plate in correspondence with the base 39, with a plurality of dome buttons 33 formed on one side in correspondence with the push protrusions formed on the reverse side of the holder 15. Also, there are receiving holes 37 formed on the printed circuit board 31 in which at least portions of the Hall sensors 35 may be inserted. The printed circuit board 31 is formed with a diameter somewhat shorter than the diameter of the base 39, in order to allow a sufficient area where the securing portion 19 of the holder 15 may be secured.

The dome buttons 33 are pressed by push protrusions (not shown) formed on the reverse side of the holder 15 to perform separate functions. While in this embodiment the dome buttons 33 are illustrated as being pressed by means of the wheel 11, the invention is not thus limited, and any composition may be used in which certain pressing performs separate functions. For example, pressure sensors or contact sensors may also be used instead of the dome buttons 33.

Figure 3:
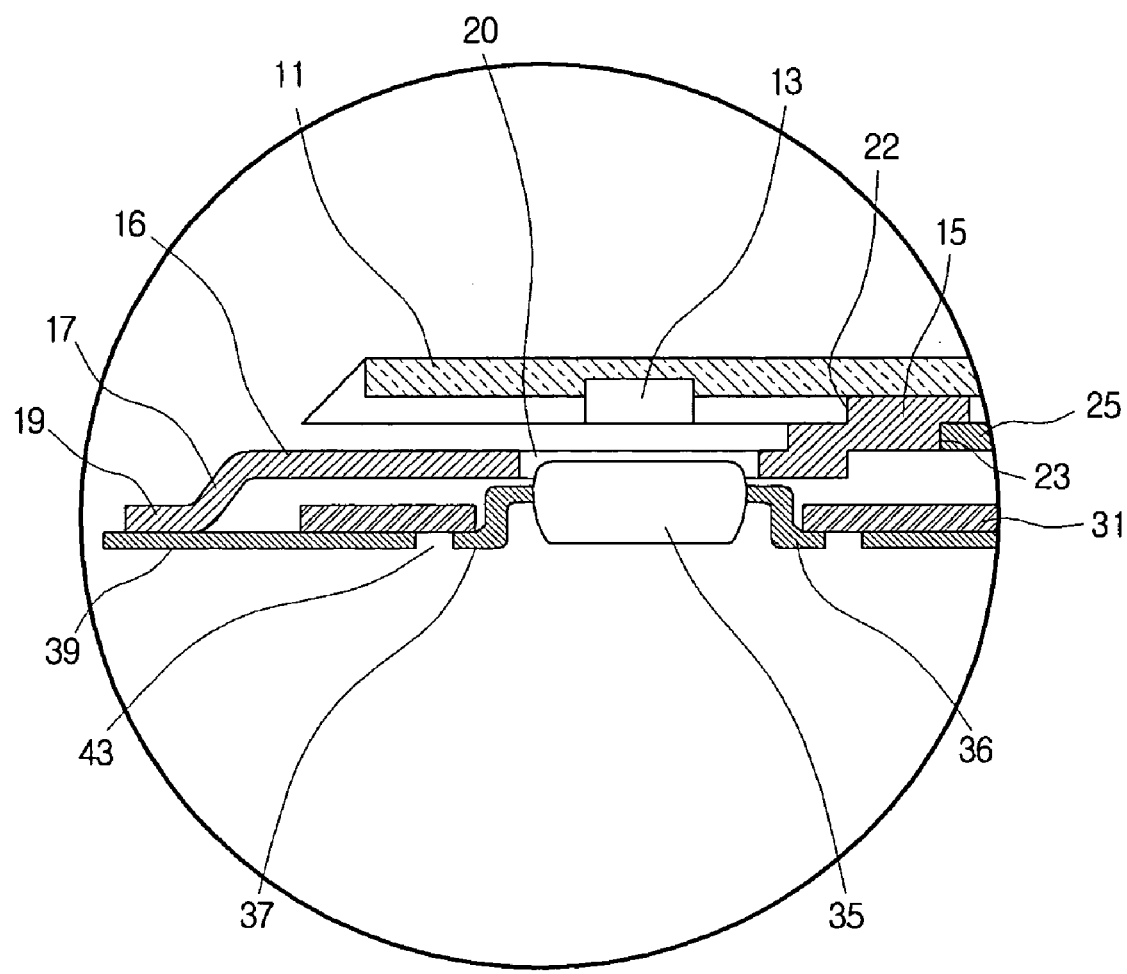
FIG. 3 is a magnified cross-sectional view of a rotary input apparatus according to an embodiment of the invention illustrating the composition of the support portion and illustrating sensors inserted into the base and printed circuit board.

The receiving holes 37 are formed on the printed circuit board 31 in correspondence with the support portion holes 20 of the holder 15, and as illustrated in FIGS. 2 and 3, at least portions of the Hall sensors 35 are positioned in the receiving holes 37. Thus, compared to the case of mounting Hall sensors 35 on the upper surface of the printed circuit board 31, the thickness of the input device in the present embodiment may be reduced by the by the thickness of a receiving hole 37.

The detection element may be a Hall sensor (Hall effect sensor), which is a silicon semiconductor using the effect of electromotive forces being generated when electrons experience the Lorentz force in a magnetic field and their direction is curved. The Hall sensors generate electromotive forces that are proportional to the rotation of the magnet 13 attached to the wheel 11, which are transferred via the printed circuit board 31 to an outside control unit (not shown).

Of course, the detection element is not limited to Hall sensors, and any element may be used which can detect the rotation of the magnet 13. For example, MR (magneto-resistive) sensors or GMR (giant magneto-resistive) sensors may be used for the detection element. An MR sensor or a GMR sensor is an element of which the resistance value is changed according to changes in the magnetic field, and utilizes the property that electromagnetic forces curve and elongate the carrier path in a solid to change the resistance. Not only are MR sensors or GMR sensors small in size with high signal levels, but also they have excellent sensitivity to allow operation in low-level magnetic fields, and they are also superior in terms of temperature stability.

When the detection element consists of Hall sensors 35, the Hall sensors 35 are secured to the printed circuit board 31 by leads 36, where the leads 36 are inserted through the insertion holes 43 of the base 39 and secured to the reverse side of the printed circuit board 31.

The base 39, as illustrated in FIG. 1, has the shape of a circular plate, and rotatably supports the holder 15 and the wheel 11. The diameter of the base 39 is formed to be somewhat longer than that of the printed circuit board 31. Also, insertion holes 43 are formed on the base 39 in correspondence with the receiving holes 37 of the printed circuit board 31. As illustrated in FIG. 3, portions of the Hall sensors 35 are positioned in the insertion holes 43, whereby the thickness of the rotary input apparatus may further be reduced by the thickness of the insertion holes 43.

Below, a description will be given of the operation of a rotary input apparatus according to the present embodiment.

When a rotational force is applied by a user on an outer side of the center key 29, the wheel 11 is rotated while inserted onto the perimeter 22 of the holder 15, which causes the magnet 13 to rotate together with the wheel 11. As the magnet 13 has a multiple number of alternately magnetized N- and S-poles, the Hall sensors 35 can sense the changes in poles due to the rotation of the magnet 13, to recognize the rotation direction, speed, and angle of the wheel 11. The Hall sensors 35 generate output signals corresponding to the rotation direction, rotation angle, and rotation speed of the wheel 11, which are transmitted via the printed circuit board 31 to an outside control unit, and the control unit identifies the output signals to perform an input corresponding to the rotation of the wheel 11.

Also, when an outer side of the center key 29 is pressed by a user, the wheel 11 is tilted in one direction while elastically supported by the holder 15, which causes the push protrusions (not shown) formed on the reverse side of the holder 15 to press the dome buttons 33. This allows each of the dome buttons 33 positioned on the printed circuit board 31 to perform its own function. For example, in the input apparatus illustrated in FIGS. 1 to 3, there are four dome buttons 33 in equal intervals that can be pressed by the push protrusions, where each dome button 33 may function as a hot key for launching a text message function, searching phone numbers, connecting to the Internet, or receiving satellite broadcasts, etc. In addition, the center key 29 may also perform a separate function when pressed by a user.

Such a rotary input apparatus may be used in a mobile terminal such as a laptop or PDA (personal digital assistant), as well as in a mobile phone.

The present invention can thus provide a rotary input apparatus which has a reduced thickness, and which outputs rotation speed, direction, and angle, etc., to allow various types of input.

The invention can also provide a rotary input apparatus which has superior endurance to external impact, etc.

While the above description has pointed out novel features of the invention as applied to the embodiments disclosed above, it is to be construed that various permutations and modifications are included within the scope of the present invention.

What is claimed is:

1. A rotary manipulation input apparatus, comprising:
   a rotatable wheel;
   a multi-pole ring-type magnet secured to the bottom of the wheel to rotate together with the wheel;
   a printed circuit board having one or more detection elements mounted thereon, the detection elements to detect rotation of the magnets;
   a base having the printed circuit board secured to a side thereof; and
   a holder joined to a side of the base and rotatably supporting the wheel, wherein
   the holder comprises a body portion positioned in contact with the wheel, an inclination portion extending in a particular angle from the body portion, and a securing portion extending from an end of the inclination portion and joined to a side of the base, and
   the holder and the base are made of metal.

2. The rotary manipulation input apparatus of claim 1, wherein the printed circuit board having one or more receiving holes formed therein in correspondence with the detection elements,
   at least a portion of the detection elements is inserted in the receiving holes.

3. The rotary manipulation input apparatus of claim 1, wherein the base has one or more insertion holes in which at least a portion of the detection elements is positioned in correspondence with the receiving holes.

4. The rotary manipulation input apparatus of claim 1, wherein the detection element is a Hall sensor or an MR sensor.

5. The rotary manipulation input apparatus of claim 1, wherein
   the body portion has an insertion hole and one or more ledges formed adjacent to the insertion hole,
   the wheel has securing protrusions protruding downwards, and
   a washer having one or more rotation holes of predetermined central angles formed therein is inserted onto the ledges, the securing protrusions being inserted into the rotation holes.

6. The rotary manipulation input apparatus of claim 1, wherein the holder has one or more support portion holes, formed in positions corresponding to the detection elements, in which at least portions of the detection elements are positioned.

7. The rotary manipulation input apparatus of claim 1, wherein
   a center key formed at the center of the wheel, and
   a dome button formed on the printed circuit board that enables the center key to press the dome button.

* * * * *